United States Patent
Smith et al.

[11] Patent Number: 6,022,812
[45] Date of Patent: Feb. 8, 2000

[54] VAPOR DEPOSITION ROUTES TO NANOPOROUS SILICA

[75] Inventors: Douglas M. Smith; Teresa Ramos; Kevin H. Roderick, all of Albuquerque, N.Mex.

[73] Assignee: AlliedSignal Inc., Morristown, N.J.

[21] Appl. No.: 09/111,083

[22] Filed: Jul. 7, 1998

[51] Int. Cl.⁷ .................................................. H01L 21/316
[52] U.S. Cl. ........................ 438/761; 438/763; 438/790
[58] Field of Search ................................ 438/790, 761, 438/763

[56] References Cited

U.S. PATENT DOCUMENTS 5,360,646  11/1994  Morita ..................................... 427/574
5,804,509   9/1998  Cho ......................................... 438/790

FOREIGN PATENT DOCUMENTS 0775669  5/1997  European Pat. Off. .

*Primary Examiner*—Charles Bowers
*Assistant Examiner*—Renzo Rocchegiani
*Attorney, Agent, or Firm*—Leslie A. Weise

[57] ABSTRACT

A process for the manufacture of nanoporous silica dielectric films by vapor deposition of silica precursors on a substrate. The process provides for vaporizing at least one alkoxysilane composition; depositing the vaporized alkoxysilane composition onto a substrate; exposing the deposited alkoxysilane composition to a water vapor, and either an acid or a base vapor; and drying the exposed alkoxysilane composition, thereby forming a relatively high porosity, low dielectric constant, silicon containing polymer composition on the substrate.

24 Claims, 1 Drawing Sheet

VAPOR DEPOSITION ROUTES TO NANOPOROUS SILICA

BACKGROUND OF THE INVENTION

1. FIELD OF THE INVENTION

The invention relates to nanoporous dielectric films and to a process for their manufacture. Such films are useful in the production of integrated circuits.

2. DESCRIPTION OF THE PRIOR ART

The desire for lower dielectric constant materials for use as intermetal and interlevel dielectrics for technology nodes at 0.18 micron feature sizes and below is well-known in the semiconductor industry. Although the need for obtaining such films has been known for a number of years, commercially available materials have been limited to a those having a dielectric constant in the range of k>2.7. Although low dielectric constant materials are required, a number of other criteria must also be met for a useful dielectric material in the semiconductor uses. These criteria include electrical leakage, breakdown, and electromigration; high chemical purity, a six month or better storage life, low moisture adsorption, chemical resistance; thickness uniformity, low stress, low shrinkage, and crack resistance; high thermal stability, low thermal expansion, low thermal weight loss; and low cost. Nanoporous silicas are good materials which meet these criteria and also offer dielectric constants of 2.7 and below.

In addition to a low dielectric constant, nanoporous silica offers other advantages for microelectronics applications including thermal stability up to 900° C., pore sizes which are smaller than microelectronics features; a material that is widely used in the semiconductor industry, namely silica and its precursors; deposition using tools simiar to those employed for conventional spin-on glass (SOG) processing; as well as the ability to tune dielectric constants over a wide range k=1.3–2.5. Nanoporous silicas also avoid thickness constraints from cracking as observed with conventional SOG's, and have the ability to migrate the same dielectric material and integration scheme for multiple semiconductor technology nodes by tuning the dielectric constant to lower values. Although nanoporous silica has these advantages, it also may suffer from several disadvantages which are common to most SOG materials. These include a relatively large raw material consumption. For a 200 mm wafer, 3 to 8 cm$^3$ of silica precursor is typically deposited for each dielectric layer. However, the actual volume of the film is on the order of 0.1 cm$^3$. Therefore, a significant fraction of the silica precursor is lost which results in higher costs to the IC manufacturer. A large volume of solvent is typically used in SOG and nanoporous silica precursors in order to lower viscosity for deposition. However, the evaporation of the solvent results in a concentration of impurities in the film. As IC dimensions continue to shrink, IC manufacturers require ever lower impurity levels which thus require the use of extremely pure solvents which adds a nontrivial expense to the precursor production. As a result of changes in fluid dynamics and mass transfer across the wafer, the problem of achieving film uniformity, thickness and refractive index can be difficult. This problem becomes more difficult as substrate sizes increase and for nonuniform shapes such as flat panel displays. Often, spin-on materials suffer from the appearance of a number of different kinds of film defects arising from the complex drying and polymerization processes. Furthermore, the extent of local and global planarization depends on a complex interrelationships among a number of variables. Using a deposition technique other than spin deposition could result in different planarization results.

This invention solves the above problems by depositing a nanoporous silica precursor on a wafer by condensation of silica presursors from the vapor phase. In this way, essentially all of the precursor is transformed into silica, resulting in much higher yields, lower solvent consumption, and higher purity. In addition, the film uniformity is better than for films deposited by a liquid spin-on glass technique.

According to the invention, a silica precursor is deposited onto the wafer from a vapor. This may be conducted by silica precursor deposition from the vapor phase to form a liquid-like film on the wafer surface. This may also include co-deposition from the vapor phase of a solvent, and/or solvent vapor deposition before or after the silica precursor. Polymerization and gelation caused by exposure of the silica precursor to an initiator or catalyst such as an acidic or basic vapor, water vapor, thermal means, light or other means that cause gelation. This intermediate product is a wet gel film in which the pores of the film contain a fluid which can be removed by subsequent drying. Drying the polymerized film then yields a porous silica film with pore size on the order of nanometers. Additional optional steps may include a treatment to make the film hydrophobic, a heat treatment before polymerization to aid in planarization and gap filling, i.e. reflow, and/or aging and thermal curing before or after drying to increase film strength.

SUMMARY OF THE INVENTION

The invention provides a process for forming a nanoporous dielectric coating on a substrate which comprises a) vaporizing at least one alkoxysilane composition;

b) depositing the vaporized alkoxysilane composition onto a substrate;

c) exposing the deposited alkoxysilane composition to a water vapor, and either an acid or a base vapor; and d) drying the exposed alkoxysilane composition, thereby forming a relatively high porosity, low dielectric constant, silicon containing polymer composition on the substrate.

The invention also provides a semiconductor device produced by a process which comprises a) vaporizing at least one alkoxysilane composition;

b) depositing the vaporized alkoxysilane composition onto a semiconductor substrate;

c) exposing the deposited alkoxysilane composition to a water vapor, and either an acid or a base vapor; and d) drying the exposed alkoxysilane composition, thereby forming a relatively high porosity, low dielectric constant, silicon containing polymer composition on the semiconductor substrate.

DETAILED DESCRIPTION OF THE PREFERRED EMBODIMENT

Figure 1:
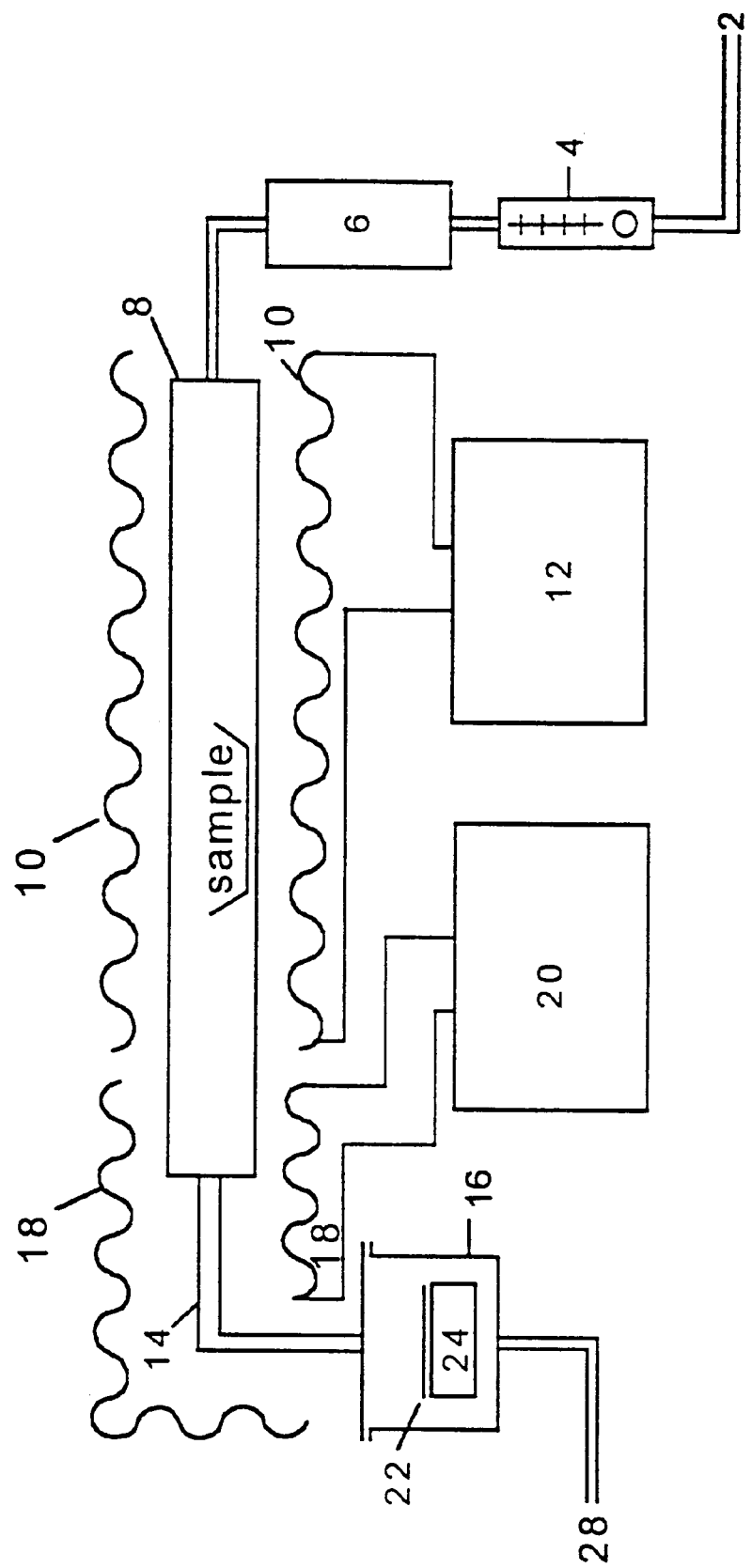
FIG. 1 shows a schematic representation of an apparatus suitable for conducting the process of the invention.

In the inventive process, one begins by vaporizing at least one alkoxysilane composition. The alkoxysilane comprises one or more components selected from the group consisting of alkoxysilanes having the formula:

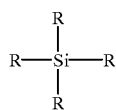

wherein at least 2 of the R groups are independently $C_1$ to $C_4$ alkoxy groups, alkylalkoxy groups wherein the alkyl moiety is $C_1$ to $C_4$ alkyl and the alkoxy moiety is $C_1$ to $C_6$ alkoxy, or ether-alkoxy groups; and the balance, if any, are independently selected from the group consisting of hydrogen, alkyl, phenyl, halogen, substituted phenyl. In one preferred embodiment each R is methoxy, ethoxy or propoxy. In another preferred embodiment at least two R groups are alkylalkoxy groups wherein the alkyl moiety is $C_1$ to $C_4$ alkyl and the alkoxy moiety is $C_1$ to $C_6$ alkoxy. In yet another preferred embodiment at least two R groups are ether-alkoxy groups of the formula $(C_1$ to $C_6$ alkoxy$)_n$ wherein n is 2 to 6.

The silica precursor could be any or a combination of alkoxysilanes such as tetraethoxysilane, tetrapropoxysilane, tetraisopropoxysilane, tetra(methoxyethoxy)silane, tetra (methoxyethoxyethoxy)silane which have four groups which may be hydrolyzed and than condensed to produce silica, alkylalkoxysilanes such as methyltriethoxysilane silane, arylalkoxysilanes such as phenyltriethoxysilane and precursors such as triethoxysilane which yield SiH functionality to the film. Tetrakis(methoxyethoxyethoxy)silane, tetrakis(ethoxyethoxy)silane, tetrakis(butoxyethoxyethoxy) silane, tetrakis(2-ethylthoxy)silane, tetrakis (methoxyethoxy)silane, and tetrakis(methoxypropoxy) silane are particularly useful for the invention. Additionally, partially hydolyzed, condensed or polymerized derivatives of these species can be used in this invention. Other precursors of utility to this invention could include precursors which can be thermally or photolytically crosslinked. In general, the precursors can be gases, liquids or solids at room temperature.

The silica precursor composition may optionally comprise a solvent composition, water and/or a catalytic amount of an acid. Water provides a medium for hydrolyzing the alkoxysilane. Preferably the solvent composition can comprises a relatively high volatility solvent or a relatively low volatility solvent. A relatively high volatility solvent is one which preferably has a boiling point of about 120° C. or less, preferably about 100° C. or less. Suitable high volatility solvents nonexclusively include methanol, ethanol, n-propanol, isopropanol, n-butanol and mixtures thereof. Other relatively high volatility solvent compositions which are compatible with the other ingredients can be readily determined by those skilled in the art.

A relatively low volatility solvent composition is one which preferably has a boiling point of about 175° C. or higher, more preferably about 200° C. or higher. Suitable low volatility solvent compositions nonexclusively include alcohols and polyols including glycols such as ethylene glycol, 1,4-butylene glycol, 1,5-pentanediol, 1,2,4-butanetriol, 1,2,3-butanetriol, 2-methyl-propanetriol, 2-(hydroxymethyl)-1,3-propanediol, 1,4,1,4-butanediol, 2-methyl-1,3-propanediol, tetraethylene glycol, triethylene glycol monomethyl ether, glycerol and mixtures thereof Other relatively low volatility solvent compositions which are compatible with the other ingredients can be readily determined by those skilled in the art.

The optional acid serves to catalyze the reaction of the alkoxysilane with the relatively high volatility solvent, relatively low volatility solvent and water. Suitable acids are nitric acid and compatible organic acids which are volatile, i.e. which evaporate from the resulting reaction product under the process operating conditions, and which do not introduce impurities into the reaction product. Preferably the precursor components are purified, such as by distillation such that the alkoxysilane composition has no more than about 250 parts per billion of trace metal impurities.

The alkoxysilane component is preferably present in an amount of from about 3% to about 100% by weight of the precursor composition. A more preferred range is from about 20% to about 100% and most preferably from about 50% to about 100%.

The solvent component may be present in an amount of from about 0% to about 95% by weight of the precursor composition. A more preferred range is from about 0% to about 80% and most preferably from about 0% to about 50%. While the precursor composition can contain more than one solvent, it is preferred that it not contain both a high and a low volatility solvent. It is preferred that the solvent or solvent mixture evaporate at a relatively constant rate. In the alternative, one or more solvents can be applied singly, sequentially or in mixture to the substrate prior to the application of the alkoxysilane or after the application of the alkoxysilane. Such can aid precursor viscosity, pore control or to help the miscibility of water vapor into the silane.

When both a high and a low volatility solvent are applied in a mixture prior to the application of the alkoxysilane or after the application of the alkoxysilane, the high volatility solvent component may present in an amount of from about 1% to about 90% by weight of the precursor composition. A more preferred range is from about 1% to about 50% and most preferably from about 1% to about 30%. When both a high and a low volatility solvent are present, the low volatility solvent component may be present in an amount of from about 1 to about 40% by weight of the precursor composition. A more preferred range is from about 1% to about 20% and most preferably from about 1% to about 10%.

The mole ratio of water to silane may be from about 0 to about 50. A more preferred range is from about 0 to about 10 and most preferably from about 0 to about 1.5. The acid is present in a catalytic amount which can be readily determined by those skilled in the art. Preferably the molar ratio of acid to silane ranges from about 0 to about 0.2, more preferably from about 0 to about 0.05, and most preferably from about 0 to about 0.02.

The alkoxysilane containing precursor composition is then deposited onto a substrate, preferably a semiconductor substrate, optionally having a pattern of lines on its surface and forms a dielectric film on the surface. Typical substrates are those suitable to be processed into an integrated circuit or other microelectronic device. Suitable substrates for the present invention non-exclusively include semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. The lines, when present, are typically formed by well known lithographic techniques and may be composed of a metal, an oxide, a nitride or an oxynitride. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

For deposition on the substrate, the precursor composition is vaporized in any of several ways such as by flowing an inert carrier gas, such as nitrogen, past the precursor into a deposition chamber or by heating the precursor relative to the substrate temperature. An apparatus suitable for depositing the precursor is shown schematically in FIG. 1 and described more fully hereinafter. Other suitable apparatus can easily be determined by those skilled in the art. In general, the precursor temperature is raised significantly above the temperature of the substrate to allow adequate deposition rates. The precursor is preferably vaporized by heating the alkoxysilane composition to a temperature of from about 0° C. to about 300° C., preferably from about 150° C. to about 240° C. and more preferably from about 200° C. to about 220° C.

The vaporized precursor is deposited onto the substrate by allowing the inert carrier gas to carry the vaporized precursor onto the substrate where it forms into a uniform layer on the substrate. It is desirable that the precursor be a liquid at the substrate temperature although the substrate can be subsequently heated to liquefy the precursor film on the wafer. The reaction chamber must be designed in such a way such that uniform deposition is obtained. Such techniques are well-known to those skilled in the art of vapor deposition. Either before or after precursor deposition, it may be desirable to also deposit a solvent to create porosity in the precursor. More desirable is to create the solvent in-situ by hydrolyzing groups from the precursor. Whether using added solvent or solvent added in-situ, it is desirable that the volume fraction of solvent in the film be approximately equal to the volume fraction of porosity desired in the final film.

Depending upon the precursor employed, gelation/polymerization is next initiated. The reaction product is hydrolyzed and condensed until it forms a gel layer. For example, this could be undertaken by flowing a stream of water vapor and an acid vapor or base vapor such as ammonia past the substrate. For purposes of this invention, a base vapor includes gaseous bases. Preferably the coating is first exposed to a water vapor and then exposed to the acid vapor or the base vapor, however, in an alternate embodiment, the coating may first be exposed to the acid vapor or the base vapor and then the water vapor. The exposures may be conducted at atmospheric pressure, sub-atmosperic pressure or super-atmospheric pressure. Suitable bases for use in the base vapor nonexclusively include ammonia and amines, such as primary, secondary and tertiary alkyl amines, aryl amines, alcohol amines and mixtures thereof which have a boiling point of about 200° C. or less, preferably 100° C. or less and more preferably 25 ° C. or less. Preferred amines are methylamine, dimethylamine, trimethylamine, n-butylamine, n-propylamine, tetramethyl ammonium hydroxide, piperidine and 2-methoxyethylamine. The ability of an amine to accept a proton in water is measured in terms of the basicity constant $K_b$, and $pK_b = -\log K_b$. In the preferred embodiment, the $pK_b$ of the base may range from about less than 0 to about 9. A more preferred range is from about 2 to about 6 and most preferably from about 4 to about 5. Suitable acid vapors nonexclusively include nitric acid and compatible organic acids which are volatile, i.e. which evaporate from the resulting reaction product under the process operating conditions, and which do not introduce impurities into the reaction product.

In the preferred embodiment, the mole ratio of water vapor to acid or base vapor ranges from about 1:3 to about 1:100, preferably from about 1:5 to about 1:50, and more preferably from about 1:10 to about 1:30.

The water vapor causes a continued hydrolysis of the alkoxysilane alkoxy groups, and the acid or base catalyzes condensation of the hydrolyzed alkoxysilane and serves to increase molecular weight until the coating gels and ultimately increases gel strength. Finally, the wafer is heated causing the solvent to be removed. The solvent evaporates over a period of seconds or minutes, preferably from about 1 minute to about 10 minutes. The film is dried in a conventional way. Elevated temperatures may be employed to dry the coating in this step. Such temperatures may range from about 100° C. to about 600° C., preferably from about 200° C. to about 400° C. and more preferably from about 300° C. to about 350° C. As a result, a relatively high porosity, low dielectric constant, silicon containing polymer composition forms on the substrate. The silicon containing polymer composition preferably has a dielectric constant of from about 1.1 to about 3.5, more preferably from about 1.3 to about 3.0, and most preferably from about 1.5 to about 2.5. The pore size of silica composition ranges from about 1 nm to about 100 nm, more preferably from about 2 nm to about 30 nm, and most preferably from about 3 nm to about 20 nm. The density of the silicon containing composition, including the pores, ranges from about 0.1 to about 1.9 g/cm$^3$, more preferably from about 0.25 to about 1.6 g/cm$^3$, and most preferably from about 0.4 to about 1.2 g/cm$^3$.

For some embodiments of the invention, it may be desirable to react remaining silanol groups in the gel with a surface modification agent such as hexamethyldisilazane. This may be done by flowing hexamethyldisilazane vapor past the wafer before or after the drying step. The following non-limiting examples serve to illustrate the invention.

EXAMPLES

FIG. 1 exemplifies a deposition apparatus suitable for conducting the examples. The apparatus is comprised of a pipe 2 which is connected to a source of inert carrier gas such as nitrogen. The source flow rate of the nitrogen is controlled by a rotometer 4 and passes through a desiccant 6 to remove any moisture. The pipe connects to a precursor sample chamber 8 which is preferably a steel tube which contains the precursor material which is to be deposited. The chamber is surrounded by a heating tape 10 which is controlled by temperature controller 12. A pipe 14 exiting the sample chamber carries vaporized precursor and carrier gas to a deposition chamber 16. Pipe 14 is preferably surrounded by a heating tape 18 which is controlled by temperature controller 20. The temperature controllers and heating tapes uniformly heat the pipes and sample chamber.

Deposition chamber 16 is preferably a stainless steel container of approximately six inches in diameter and 7.5 inches long. It is large enough to contain a 4 inch silicon wafer 22 and a steel block 24 which is 4 inches in diameter and 2.5 inches thick, on which the wafer 22 sits. This block 24 sits 3 to 4 inches below the exit from the pipe 14 outlet, which comes through the top of the chamber 16. The wafer 22 is placed on top of block 24 such that the gas flow from the pipe 14 impinges directly on the surface of the wafer 22. The top and bottom of deposition chamber 16 separate so the block 24 and the wafer 22 can be placed inside. When the deposition chamber top and bottom are joined, they form an airtight seal. The deposition chamber has an outlet 26 at the bottom through which the carrier gas can exit to an exhaust within a fume hood 28.

Example 1

This example illustrates a process wherein a precursor, tetrakis(methoxyethoxyethoxy)-silane is deposited in the vapor phase onto a silicon wafer which is then aged for a given period of time and dried.

The precursor is tetrakis(methoxyethoxyethoxy)-silane (Gelest Inc., Tullytown, Pa.). This precursor material is distilled to remove the impurity (2-(2-methoxyethoxy) ethanol) which is found in quantities of up to 5% by weight in the silane. The distillation was accomplished by placing 5 ml of the precursor in a crucible and placing the crucible in the steel tube and heating to 240° C. for 5 hours, while flowing dry nitrogen gas through the tube at 100 cc/minute, and out the exhaust at the bottom of the deposition chamber. The wafer and block are not in the chamber while the precursor is distilled.

The distilled precursor was deposited as follows. The pipe in which the precursor was placed was heated using its temperature controller 12 to 240° C., the connecting tube was heated to 246° C. using temperature controller 20. The block was cooled to 5° C., placed in the chamber so that it was 4 inches below the top of the chamber when the top and bottom are attached. A blank 4 inch silicon wafer was placed on top of the block and the chamber was closed. The nitrogen flow was turned on at a rate of 200 cc/minute and allowed to flow for 5 minutes.

Next the chamber was opened and the wafer was removed and placed into an aging chamber (a sealable chamber with a volume of~1 liter) with 5 ml ammonium hydroxide 28–30%, sealed and left for 8 minutes. The wafer was then removed from the chamber and dried in an oven at 170° C. for 10 minutes, followed by 2 minutes in a 320° C. oven. The film deposited on the wafer was approximately 3 cm in diameter and at the center of the wafer. The film was characterized by ellipsometry to have an average thickness of 2500 angstroms and an average refractive index of 1.108, which corresponds to a density of 0.52 g/cc.

Example 2

This example illustrates a process wherein a precursor, tetrakis(methoxyethoxyethoxy)-silane is deposited in the vapor phase onto a silicon wafer which is then aged for a given period of time and then dried. In this example, the nitrogen flow rate is increased and allowed to flow for a longer time to increase the rate of deposition.

The precursor is tetrakis(methoxyethoxyethoxy)-silane. This precursor material is distilled to remove the impurity (2-(2-methoxyethoxy)ethanol) which is found in quantities of up to 5% by weight in the silane. The distillation was accomplished by placing 5 ml of the precursor in a crucible and placing the crucible in the steel tube and heating to 240° C. for 5 hours, while flowing dry nitrogen gas through the tube at 100 cc/minute, and out the exhaust at the bottom of the deposition chamber. The wafer and block are not in the chamber while the precursor is distilled.

The distilled precursor was deposited as follows. The pipe in which the precursor was placed was heated using temperature controller 12 to 240° C., the connecting tube was heated to 246° C. using temperature controller 20. The block was cooled to 6° C., placed in the chamber so that it was 4 inches below the top of the chamber when the top and bottom are attached. A blank 4 inch silicon wafer was placed on top of the block and the chamber was closed. The nitrogen flow was turned on at a rate of 300 cc/minute and allowed to flow for 15 minutes. Next the chamber was opened and the wafer was removed and placed into an aging chamber (a sealable chamber with a volume of~1 liter) with 5 ml ammonium hydroxide 28–30%, sealed and left for 10 minutes. The wafer was then removed from the chamber and dried in an oven at 170° C. for 10 minutes, followed by 2 minutes in a 320° C. oven. The film deposited on the wafer was approximately 4 cm in diameter and at the center of the wafer. The film was characterized by ellipsometry to have an average thickness of 6250 angstroms and an average refractive index of 1.093 which corresponds to a density of 0.45 g/cc. This film was examined by SEM and shown to be porous and of a thickness of approximately 6250 angstroms.

Example 3

This example illustrates a process wherein a precursor, tetrakis(methoxyethoxyethoxy)-silane is deposited in the vapor phase onto a silicon wafer which is then aged for a given period of time and then dried. In this example the nitrogen flow rate is held constant (300 cc/min.) and allowed to flow for a longer time (30 min.) to increase the deposition.

The precursor is distilled tetrakis(methoxyethoxyethoxy)-silane. In this example the precursor material is the same as that distilled and used in Example 2. The distilled precursor was deposited as follows. The pipe in which the precursor was placed was heated using temperature controller 12 to 240° C., the connecting tube was heated to 246° C. using temperature controller 20. The block was cooled to 8° C., placed in the chamber so that it was 4 inches below the top of the chamber when the top and bottom are attached. A blank 4 inch silicon wafer was placed on top of the block and the chamber was closed. The nitrogen flow was turned on at a rate of 300 cc/minute and allowed to flow for 30 minutes. Next the chamber was opened and the wafer was removed and placed into an aging chamber (a sealable chamber with a volume of~1 liter) with 5 ml ammonium hydroxide 28–30%, sealed and left for 10 minutes. The wafer was then removed from the chamber and dried in an oven at 170° C. for 10 minutes, followed by 2 minutes in a 320° C. oven. The film deposited on the wafer was approximately 4 cm in diameter and at the center of the wafer. The film was characterized by ellipsometry to have an average thickness of 9400 angstroms and an average refractive index of 1.125 which corresponds to a density of 0.60 g/cc.

Example 4

This example illustrates a process wherein a precursor, tetrakis(ethoxyethoxy)-silane is deposited in the vapor phase onto a silicon wafer which is then aged for a given period of time and then dried.

The precursor is tetrakis(ethoxyethoxy)-silane. This precursor material is distilled to remove the impurity (2-(2-ethoxy)ethanol) which is found in quantities of up to 5% by weight in the silane. The distillation was accomplished by placing 5 ml of the precursor in a crucible and placing the crucible in the steel tube and heating to 230° C. for 5 hours while flowing dry nitrogen gas through the tube at 100 cc/minute, and out the exhaust at the bottom of the deposition chamber. The wafer and block are not in the chamber while the precursor is distilled. The distilled precursor was deposited as follows. The pipe in which the precursor was placed was heated using temperature controller 12 to 230° C., the connecting tube was heated to 235° C. using temperature controller 20. The block was cooled to 6° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 20 minutes.

Next the chamber was opened and the wafer was removed and placed into an aging chamber (a sealable chamber with a volume of ~1 liter) with 5 ml ammonium hydroxide 28–30%, sealed and left for 10 minutes. The wafer was then removed from the chamber and dried in an oven at 170° C. for 10 minutes, followed by 2 minutes in a 320° C. oven.

The film deposited on the wafer covered the entire wafer and had a central spot that was approximately 4 cm in diameter and at the center of the wafer cracked and flaked off during the drying process. The remaining film outside the central spot was characterized by ellipsometry to have an average thickness of 19,400 angstroms and an average refractive index of 1.265 which corresponds to a density of 1.26 g/cc.

Example 5

This example illustrates a process wherein a precursor, tetrakis(ethoxyethoxy)-silane is deposited in the vapor phase onto a silicon wafer which is then aged for a given period of time and then dried. In this example, the deposition conditions are changed in the deposition apparatus to have an a final effect on the over-all deposition.

The precursor is tetrakis(ethoxyethoxy)-silane. In this example the precursor material is the same as that distilled and used in Example 4.

The distilled precursor was deposited as follows. The pipe in which the precursor was placed was heated using temperature controller 12 to 235° C., the connecting tube was heated to 240° C. using temperature controller 20. The block was cooled to 8° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 10 minutes. Next the chamber was opened and the wafer was removed and placed into an aging chamber (a sealable chamber with a volume of~1 liter) with 5 ml ammonium hydroxide 28–30%, sealed and left for 10 minutes. The wafer was then removed from the chamber and dried in an oven at 170° C. for 10 minutes, followed by 2 minutes in a 320° C. oven. The film deposited on the wafer covered the entire wafer and had a central spot that was approximately 4 cm in diameter and at the center of the wafer cracked and flaked off during the drying process. The remaining film outside the central spot was characterized by ellipsometry to have an average thickness of 22,200 angstroms and an average refractive index of 1.278 which corresponds to a density of 1.34 g/cc.

Example 6

This example illustrates a process wherein a precursor, tetrakis(ethoxyethoxy)-silane is deposited in the vapor phase onto a silicon wafer which is then aged for a given period of time and then dried. In this example, the deposition conditions are changed in the deposition apparatus to have a final effect on the over-all deposition.

The precursor is tetrakis(ethoxyethoxy)-silane. This precursor material is distilled to remove the impurity (2-(2-ethoxy)ethanol) which is found in quantities of up to 5% by weight in the silane. The distillation was accomplished by placing 5 ml of the precursor in a crucible and placing the crucible in the steel tube and heating to 200° C. for 5 hours while flowing dry nitrogen gas through the tube at 100 cc/minute, and out the exhaust at the bottom of the deposition chamber. The wafer and block are not in the chamber while the precursor is distilled.

The distilled precursor was deposited as follows. The pipe in which the precursor was placed was heated using temperature controller 12 to 200° C., the connecting tube was heated to 210° C. using temperature controller 20. The block was cooled to 10° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 15 minutes.

Next the chamber was opened and the wafer was removed and placed into an aging chamber (a sealable chamber with a volume of~1 liter) with 5 ml ammonium hydroxide 28–30%, sealed and left for 10 minutes. The wafer was then removed from the chamber and dried in an oven at 170° C. for 10 minutes, followed by 2 minutes in a 320° C. oven. The film deposited on the wafer covered the entire wafer. The film was characterized by ellipsometry to have an average thickness of 22,000 angstroms and an average refractive index of 1.112 which corresponds to a density of 0.53 g/cc.

Example 7

This example illustrates a process wherein a precursor is deposited in the vapor phase into a silicon wafer which is then aged for a given period of time and then dried. In this example, the deposition conditions are changed in the deposition apparatus to have final effect on the over-all deposition. The precursor is tetrakis(ethoxyethoxy)-silane. In this example the precursor material is the same as that distilled and used in Example 6.

The distilled precursor was deposited as follows. The pipe in which the precursor was placed was heated using temperature controller 12 to 200° C., the connecting tube was heated to 210° C. using temperature controller 20. The block was cooled to 8° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 10 minutes. Next the chamber was opened and the wafer was removed and placed into an aging chamber (a sealable chamber with a volume of ~1 liter) with 5 ml ammonium hydroxide 28–30%, sealed and left for 10 minutes. The wafer was then removed from the chamber and dried in an oven at 170° C. for 10 minutes, followed by 2 minutes in a 320° C. oven. The film deposited on the wafer covered the entire wafer. The film was characterized by ellipsometry to have an average thickness of 19,300 angstroms and an average refractive index of 1.169 which corresponds to a density of 0.80 g/cc.

Example 8

This example illustrates a process wherein a precursor, tetrakis(ethoxyethoxy)-silane is deposited in the vapor phase onto a silicon wafer which is then aged for a given period of time and then dried. In this example, the deposition conditions are changed in the deposition apparatus to have a final effect on the over-all deposition.

The precursor is tetrakis(ethoxyethoxy)-silane. In this example the precursor material is the same as that distilled and used in Examples 6 and 7.

The distilled precursor was deposited as follows. The pipe in which the precursor was placed was heated using temperature controller 12 to 200° C., the connecting tube was heated to 210° C. using temperature controller 20. The block was cooled to 5° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 5 minutes. Next the chamber was opened and the wafer was removed and placed into an aging chamber (a sealable chamber with a volume of~1 liter) with 5 ml ammonium hydroxide 28–30%, sealed and left for 10 minutes. The wafer was then removed from the chamber and dried in an oven at 170° C. for 10 minutes, followed by 2 minutes in a 320° C. oven. The film deposited on the wafer covered the entire wafer. The film was characterized by ellipsometry to have an average thickness of 27,650 angstroms and an average refractive index of 1.228 which corresponds to a density of 1.09 g/cc.

Example 9

This example illustrates a process wherein a precursor, tetrakis(ethoxyethoxy)-silane is deposited in the vapor phase onto a silicon wafer which is then aged for a given period of time and then dried. In this example, the deposition conditions are changed in the deposition apparatus to have a final effect on the over-all deposition.

The precursor is tetrakis(ethoxyethoxy)-silane. In this example the precursor material is the same as that distilled and used in examples 6, 7, and 8. The distilled precursor was deposited as follows. The pipe in which the precursor was placed was heated using temperature controller 12 to 200° C., the connecting tube was heated to 210C. using temperature controller 20. The block was cooled to 10° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 20 minutes. Next the chamber was opened and the wafer was removed and placed into an aging chamber (a sealable chamber with a volume of~1 liter) with 5 ml ammonium hydroxide 28–30%, sealed and left for 20 minutes. The wafer was then removed from the chamber and dried in an oven at 170° C. for 20 minutes, followed by 2 minutes in a 320° C. oven. The film deposited on the wafer covered the entire wafer. The film was characterized by ellipsometry to have an average thickness of 33,550 angstroms and an average refractive index of 1.094 which corresponds to a density of 0.45 g/cc.

Example 10

This example illustrates a process wherein a precursor, tetrakis(ethoxyethoxy)-silane is deposited in the vapor phase onto a silicon wafer which is then aged for a given period of time and then dried. In this example, the deposition conditions are changed in the deposition apparatus to have a final effect on the over-all deposition.

The precursor is tetrakis(ethoxyethoxy)-silane. This precursor material is distilled to remove the impurity (2-(2-ethoxy)ethanol) which is found in quantities of up to 5% by weight in the silane. The distillation was accomplished by placing 5 ml of the precursor in a crucible and placing the crucible in the steel tube and heating to 200° C. for 5 hours while flowing dry nitrogen gas through the tube at 100 cc/minute, and out the exhaust at the bottom of the deposition chamber. The wafer and block are not in the chamber while the precursor is distilled.

The distilled precursor was deposited as follows. The pipe in which the precursor was placed was heated using temperature controller 12 to 200° C., the connecting tube was heated to 210° C. using temperature controller 20. The block was cooled to 8° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 15 minutes. Next the chamber was opened and the wafer was removed and placed into an aging chamber (a sealable chamber with a volume of~1 liter) with 5 ml ammonium hydroxide 28–30%, sealed and left for 2 minutes. The wafer was then removed from the chamber and dried in an oven at 170° C. for 20 minutes, followed by 2 minutes in a 320° C. oven. The film which was deposited on the wafer covered the entire wafer. The film was characterized by ellipsometry to have an average thickness of 23,500 angstroms and an average refractive index of 1.095 which corresponds to a density of 0.45 g/cc.

Example 11

This example illustrates a process wherein a precursor, tetrakis(ethoxyethoxy)-silane is deposited in the vapor phase onto a silicon wafer which is then aged for a given period of time and then dried. In this example, the deposition conditions are changed in the deposition apparatus to have a final effect on the over-all deposition.

The precursor is tetrakis(ethoxyethoxy)-silane. In this example the precursor material is the same as that distilled and used in Example 10. The distilled precursor was deposited. The deposition process was as follows: The pipe in which the precursor was placed was heated using temperature controller 12 to 200° C., the connecting tube was heated to 210° C. using temperature controller 20. The block was cooled to 7° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 15 minutes. Next the chamber was opened and the wafer was removed and placed into an aging chamber (a sealable chamber with a volume of~1 liter) with 5 ml ammonium hydroxide 28–30%, sealed and left for 5 minutes. The wafer was then removed from the chamber and dried in an oven at 170° C. for 20 minutes, followed by 2 minutes in a 320° C. oven. The film deposited on the wafer covered the entire wafer. The film was characterized by ellipsometry to have an average thickness of 30,350 angstroms and an average refractive index of 1.064 which corresponds to a density of 0.3.1 g/cc.

Example 12

This example illustrates a process wherein a precursor, tetrakis(ethoxyethoxy)-silane-is deposited in the vapor phase onto a silicon wafer which is then aged for a given period of time and then dried. In this example, the deposition conditions are changed in the deposition apparatus to have a final effect on the over-all deposition.

The precursor is tetrakis(ethoxyethoxy)-silane. In this example the precursor material is the same as that distilled and used in examples 6, 7, 8, and 9. The distilled precursor was deposited as follows. The pipe in which the precursor was placed was heated using temperature controller 12 to 200° C., the connecting tube was heated to 210° C. using temperature controller 20. The block was cooled to 10° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 15 minutes.

Next the chamber was opened and the wafer was removed and placed into an aging chamber (a sealable chamber with a volume of~1 liter) with 5 ml ammonium hydroxide 28–30%, sealed and left for 15 minutes. The wafer was then removed from the chamber and dried in an oven at 170° C. for 20 minutes, followed by 2 minutes in a 320° C. oven. The film deposited on the wafer covered the entire wafer. The film was characterized by ellipsometry to have an average thickness of 45,650 angstroms and an average refractive index of 1.094 which corresponds to a density of 0.45 g/cc.

Example 13

This example illustrates a process wherein a precursor, tetrakis(ethoxyethoxy)-silane is deposited in the vapor phase onto a silicon wafer which is then aged for a given period of time and then silylated before oven drying.

The precursor is tetrakis(ethoxyethoxy)-silane. This precursor material is distilled to remove the impurity (2-(2-ethoxy)ethanol) which is found in quantities of up to 5% by weight in the silane. The distillation was accomplished by placing 5 ml of the precursor in a crucible and placing the crucible in the steel tube and heating to 230° C. for 3 hours while flowing dry nitrogen gas through the tube at 200 cc/minute, and out the exhaust at the bottom of the deposition chamber. The wafer and block are not in the chamber while the precursor is distilled. The distilled precursor was deposited as follows. The pipe in which the precursor was placed was heated using temperature controller 12 to 200° C., the connecting tube was heated to 210° C. using temperature controller 20. The block was cooled to 8° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 15 minutes. Next the chamber was opened and the wafer was removed and placed into an aging chamber (a sealable chamber with a volume of~1 liter) with 5 ml ammonium hydroxide 28–30%, sealed and left for 10 minutes. After aging, each film was placed back on the spin chuck and washed with 30 ml of a solution comprised of 15 ml acetone mixed with 15 ml hexamethyldisilazane; the wafer was spun at 250 rpm for 15 second while the film was being washed, then the speed was increased to 1000 rpm for 15 more seconds, allowing the film to evaporate dry on the chuck. This solution was mixed at least one hour previous to use, but was never mixed more than 8 hours before use. After the film had been washed, the wafer was placed in a 170° C. oven for 3 minutes followed by a 320° C. oven for 3 minutes.

The was deposited on the wafer consisted of a central wetted spot approximately 4 cm in diameter which became hazy during the silylation process and a very thin film which covered the rest of the wafer. The central spot was so opaque that it could not be characterized by ellipsometry. The remaining film was characterized by ellipsometry to have an average thickness of 300 angstroms and an average refractive index of 1.335 which corresponds to a density of 1.60 g/cc. After the silylation, the dried film was hydrophobic.

Example 14

This example illustrates a process wherein a precursor, tetrakis(ethoxyethoxy)-silane is deposited in the vapor phase onto a silicon wafer which is then aged for a given period of time and then silylated before oven drying.

The precursor is tetrakis(ethoxyethoxy)-silane. In this example the precursor material is the same as that distilled and used in example 13. The distilled precursor was deposited as follows. The pipe in which the precursor was placed was heated using temperature controller 12 to 200° C., the connecting tube was heated to 210° C. using temperature controller 20. The block was cooled to 12° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 10 minutes. Next the chamber was opened and the wafer was removed and placed into an aging chamber (a sealable chamber with a volume of~1 liter) with 5 ml ammonium hydroxide 28–30%, sealed and left for 10 minutes. After aging, each film was placed back on the spin chuck and washed with 30 ml of a solution comprised of 15 ml acetone mixed with 15 ml hexamethyldisilazane; the wafer was spun at 250 rpm for 15 second while the film was being washed, then the speed was increased to 1000 rpm for 15 more seconds, allowing the film to evaporate dry on the chuck. This solution was mixed at least one hour previous to use, but was never mixed more than 8 hours before use. After the film had been washed, the wafer was placed in a 170° C. oven for 3 minutes followed by a 320° C. oven for 3 minutes. The was deposited on the wafer covered the entire wafer. The film was characterized by ellipsometry to have an average thickness of 16,150 angstroms and an average refractive index of 1.138 which corresponds to a density of 0.66 g/cc. After the silylation, the dried film was hydrophobic.

Example 15

This example illustrates a process wherein a precursor, tetrakis(ethoxyethoxy)-silane is deposited in the vapor phase onto a silicon wafer which is then aged for a given period of time and then silylated before oven drying. The precursor consists of tetrakis(ethoxyethoxy)-silane. In this example the precursor material is the same as that distilled and used in Examples 13 and 14.

The distilled precursor was deposited. The deposition process was as follows: The pipe in which the precursor was placed was heated using temperature controller 12 to 200° C., the connecting tube was heated to 210° C. using temperature controller 20. The block was cooled to 10° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 20 minutes. Next the chamber was opened and the wafer was removed and placed into an aging chamber (a sealable chamber with a volume of~1 liter) with 5 ml ammonium hydroxide 28–30%, sealed and left for 10 minutes. After aging, each film was placed back on the spin chuck and washed with 30 ml of a solution comprised of 15 ml acetone mixed with 15 ml hexamethyldisilazane; the wafer was spun at 250 rpm for 15 second while the film was being washed, then the speed was increased to 1000 rpm for 15 more seconds, allowing the film to evaporate dry on the chuck. This solution was mixed at least one hour previous to use, but was never mixed more than 8 hours before use. After the film had been washed, the wafer was placed in a 170° C. oven for 3 minutes followed by a 320° C. oven for 3 minutes. The film deposited on the wafer covered the entire wafer. The film was characterized by ellipsometry to have an average thickness of 33,300 angstroms and an average refractive index of 1.099 which corresponds to a density of 0.47 g/cc. After the silylation, the dried film was hydrophobic.

Example 16

This example illustrates a process wherein a precursor, tetrakis(ethoxyethoxy)-silane is deposited in the vapor phase onto a patterned silicon wafer which is then aged for a given period of time and then silylated before oven drying. The precursor is tetrakis(ethoxyethoxy)-silane. In this example the precursor material is the same as that distilled and used in Examples 6, 7, 8, 9 and 12.

The distilled precursor was deposited as follows. The pipe in which the precursor was placed was heated using temperature controller 12 to 200° C., the connecting tube was heated to 210° C. using temperature controller 20. The block was cooled to 10° C., placed in the chamber so that it was 4 inches below the top of the chamber when the top and bottom are attached. A blank 4 inch silicon wafer was placed on top of the block and the chamber was closed. The nitrogen flow was turned on at a rate of 400 cc/minute and allowed to flow for 20 minutes. Next the chamber was opened and the wafer was removed and placed into an aging chamber (a sealable chamber with a volume of~1 liter) with 5 ml ammonium hydroxide 28–30%, sealed and left for 10 minutes. The wafer was then removed from the chamber and dried in an oven at 170° C. for 20 minutes, followed by 2 minutes in a 320° C. oven.

The film was characterized by SEM and was found to be porous with a thickness which varied on different areas of the wafer from ~2500 Angstroms to ~10,000 Angstroms.

The previous examples show that good, nanoporous dielectric films can be prepared by vapor deposition of silica precursors.

What is claimed is:

1. A process for forming a nanoporous dielectric coating on a substrate which comprises
   a) vaporizing at least one alkoxysilane composition;
   b) depositing the vaporized alkoxysilane composition onto a substrate;
   c) exposing the deposited alkoxysilane composition to a water vapor, and either an acid or a base vapor; and
   d) drying the exposed alkoxysilane composition, thereby forming a relatively high porosity, low dielectric constant, silicon containing polymer composition on the substrate.

2. The process of claim 1 wherein step (a) is conducted by heating the alkoxysilane composition to a temperature of from about 0° C. to about 300 ° C.

3. The process of claim 1 wherein step (a) is conducted with water in the composition.

4. The process of claim 1 wherein step (a) is conducted with a catalytic amount of an acid in the composition.

5. The process of claim 1 wherein step (a) is conducted with at least one organic solvent in the composition.

6. The process of claim 1 wherein at least one organic solvent is applied to the substrate prior to step (b).

7. The process of claim 1 wherein at least one organic solvent is applied to the deposited alkoxysilane after step (b) but before step (c).

8. The process of claim 1 wherein the alkoxysilane comprises one or more components selected from the group consisting of alkoxysilanes having the formula:

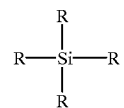

wherein at least 2 of the R groups are independently $C_1$ to $C_4$ alkoxy groups, alkylalkoxy groups wherein the alkyl moiety is $C_1$ to $C_4$ alkyl and the alkoxy moiety is $C_1$ to $C_6$ alkoxy, or ether-alkoxy groups; and the balance, if any, are independently selected from the group consisting of hydrogen, alkyl, phenyl, halogen, substituted phenyl.

9. The process of claim 8 wherein each R is methoxy, ethoxy or propoxy.

10. The process of claim 8 wherein at least two R groups are alkylalkoxy groups wherein the alkyl moiety is $C_1$ to $C_4$ alkyl and the alkoxy moiety is $C_1$ to $C_6$ alkoxy.

11. The process of claim 8 wherein at least two R groups are ether-alkoxy groups of the formula $(C_1$ to $C_6$ alkoxy$)_n$ wherein n is 2 to 6.

12. The process of claim 1 wherein the alkoxysilane comprises one or more components selected from the group consisting of tetraethoxysilane and tetramethoxysilane.

13. The process of claim 1 wherein the alkoxysilane comprises one or more components selected from the group consisting of tetrakis(methoxyethoxyethoxy)silane, tetrakis (ethoxyethoxy)silane, tetrakis(butoxyethoxyethoxy)silane, tetrakis(2-ethylthoxy)silane, tetrakis(methoxyethoxy)silane, and tetrakis(methoxypropoxy)silane.

14. The process of claim 1 wherein step (b) is conducted by flowing a mixture of vaporized alkoxysilane composition and an inert gas over the substrate.

15. The process of claim 1 wherein step (b) is conducted by flowing a vaporized alkoxysilane composition onto the substrate.

16. The process of claim 1 wherein the base vapor comprises one or more components selected from the group consisting of ammonia, amines and mixtures thereof.

17. The process of claim 1 wherein the mole ratio of water vapor to base vapor ranges from about 1:3 to about 1:100.

18. The process of claim 1 wherein the base vapor has a $pK_b$ of from about less than 0 to about 9.

19. The process of claim 1 wherein the substrate comprises raised pattern of lines comprising a metal, an oxide, a nitride and/or an oxynitride material.

20. The process of claim 1 wherein the substrate comprises a semiconductor material.

21. The process of claim 1 wherein the substrate comprises silicon or gallium arsenide.

22. The process of claim 1 wherein step (d) is conducted by heating the exposed alkoxysilane composition to a temperature of from about 100° C. to about 400° C. for from about 1 minutes to about 10 minutes.

23. The process of claim 1 wherein the alkoxysilane composition has no more than about 250 parts per billion of trace metal impurities.

24. The process of claim 1 comprising the additional step of contacting the exposed alkoxysilane composition with hexamethyldisilazane either after step (c) but before step (d) or after step (d).

* * * * *